United States Patent
Schiller et al.

(10) Patent No.: US 12,339,332 B2
(45) Date of Patent: Jun. 24, 2025

(54) AUTOMATED RESONANCE CONTROL FOR NV MAGNETOMETERS

(71) Applicant: Q.ant GmbH, Stuttgart (DE)

(72) Inventors: Ferdinand Schiller, Korntal Münchingen (DE); Robert Roelver, Calw (DE); Katharina Jag-Lauber, Winterbach (DE)

(73) Assignee: Q.ANT GMBH, Stuttgart (DE)

(*) Notice: Subject to any disclaimer, the term of this patent is extended or adjusted under 35 U.S.C. 154(b) by 0 days.

(21) Appl. No.: 18/961,530

(22) Filed: Nov. 27, 2024

(65) Prior Publication Data
US 2025/0093432 A1    Mar. 20, 2025

Related U.S. Application Data

(63) Continuation of application No. PCT/EP2023/063409, filed on May 17, 2023.

(30) Foreign Application Priority Data

May 31, 2022 (DE) .................... 10 2022 113 754.6

(51) Int. Cl.
  *G01R 33/032* (2006.01)
  *G01R 33/26* (2006.01)
(52) U.S. Cl.
  CPC ........... *G01R 33/032* (2013.01); *G01R 33/26* (2013.01)
(58) Field of Classification Search
  CPC .............................. G01R 33/032; G01R 33/26
(Continued)

(56) References Cited

U.S. PATENT DOCUMENTS 9,551,763 B1 * 1/2017 Hahn .................. G01R 33/032
10,088,336 B2 * 10/2018 Fisk ...................... G01V 1/186
(Continued)

OTHER PUBLICATIONS

Fescenko Ilja et al, Diamond magnetometer enhanced by ferrite flux concentrators, Physical Review Research, vol. 2, No. 2, Jun. 24, 2020, DOI: 10.1103/PhysRevResearch.2.023394.
(Continued)

*Primary Examiner* — Christopher P McAndrew
(74) *Attorney, Agent, or Firm* — LEYDIG, VOIT & MAYER, LTD.

(57) ABSTRACT

A method for determining an external magnetic field with an NV magnetometer includes recording single resonance signals for determining resonance frequencies by using frequency-modulated microwave radiation emitted onto a sensor material in frequency bands based on a microwave frequency and a carrier frequency, recording a double resonance signal with a dispersive form and a linear range around the resonance frequencies, determining a slope of the linear range as a scalar factor from the double resonance signal, observing a detuning of the resonance frequencies via the double resonance signal with resonant emission of the microwave radiation due to external magnetic field changes, controlling the frequency bands based on the observed detuning so that the frequency bands remain in the range of the resonance frequencies present at the detuning even after the detuning has occurred, and determining the external magnetic field from a distance of the frequency bands and the detuning $\Delta_B$.

14 Claims, 6 Drawing Sheets

(58) Field of Classification Search
USPC .......................................................... 324/304
See application file for complete search history.

(56) References Cited

U.S. PATENT DOCUMENTS

| | | |
|---|---|---|
| 10,712,408 B2 | 7/2020 | Pham et al. |
| 2010/0308813 A1* | 12/2010 | Lukin ................. G01R 33/1284 |
| | | 324/244.1 |
| 2017/0038411 A1* | 2/2017 | Yacobi ................... G01R 33/62 |
| 2017/0212046 A1* | 7/2017 | Cammerata ............ G01N 21/66 |
| 2017/0212183 A1* | 7/2017 | Egan .................... G01R 33/032 |

OTHER PUBLICATIONS

Hannah Clevenson et al, Robust High-Dynamic-Range Vector Magnetometry via Nitrogen-Vacancy Centers in Diamond, arxiv. org, Feb. 27, 2018, United States, DOI: 10.1063/1.5034216.

* cited by examiner

AUTOMATED RESONANCE CONTROL FOR NV MAGNETOMETERS

CROSS REFERENCE TO RELATED APPLICATIONS

This application is a continuation of International Application No. PCT/EP2023/063409 (WO 2023/232491 A1), filed on May 17, 2023, and claims benefit to German Patent Application No. DE 10 2022 113 754.6, filed on May 31, 2022. The aforementioned applications are hereby incorporated by reference herein.

FIELD

Embodiments of the present invention relate to a method for determining an external magnetic field with a nitrogen-vacancy (NV) magnetometer with automated resonance control, as well as to the type of NV magnetometer and to the use of one or more NV magnetometers of the type for gradiometric measurements.

BACKGROUND

The nitrogen-vacancy center is one of over 100 known defects in the diamond lattice. These defects are impurities in the pure carbon lattice of diamond. The nitrogen-vacancy center is also referred to as the NV center. Quantum sensors such as NV magnetometers utilize the extreme sensitivity of quantum systems with respect to their environment and allow for significantly improved sensors to be created. By capturing an additional electron, NV centers form a microscopic compass via the spin of the electron. By precisely manipulating and measuring the state of this NV spin, even the smallest changes in the surrounding magnetic field can be measured. This technique is called NV magnetometry and is based on the interaction between the NV center and the surrounding magnetic field. The presence of a magnetic field manifests itself in a change in the energies of the spin states of the NV center. The effect of the magnetic field can easily be recognized from the change in the microwave excitation spectrum of the NV center.

A decisive advantage of NV magnetometry stems from the well-understood behavior of the NV center spin transition frequencies, which provide clear information about the strength and direction of the magnetic field. This ability to provide self-calibrated, quantitative data combined with very high reproducibility (every NV center is the same) are key features of NV magnetometers. A major advantage of NV magnetometers is their high sensitivity to small signals. The sensitivity of an NV magnetometer to static magnetic fields depends in particular on the density of the NV centers in the diamond chip, on the quantum coherence of the NV centers and on the efficiency of the optical readout. Changes in the magnetic field, temperature and/or pressure shift the magnetic resonances of the NV center ground state, which are used for the magnetic field measurement of the NV magnetometer. This leads to a limited dynamic range of the NV magnetometer and a poorer signal-to-noise ratio (SNR).

The article by H. Clevenson et al. in Appl. Phys. Lett 112, 252406 (2018) discloses a robust, scale-factor-free vector magnetometer that uses a closed-loop frequency-locking scheme to simultaneously track Zeeman-split resonance pairs of nitrogen-vacancy centers (NV centers) in diamond. Nevertheless, it would be desirable to further increase the dynamic range and bandwidth of the NV magnetometer with regard to the magnetic field changes that can be detected, as well as to improve the SNR of the measurements and enable an extension to gradiometric magnetic field measurements while simultaneously suppressing temperature and pressure fluctuations.

SUMMARY

Embodiments of the present invention provide a method for determining an external magnetic field with a nitrogen-vacancy (NV) magnetometer with automated resonance control. The NV magnetometer includes a sensor material with NV centers with respective spin states $m_s=0, \pm 1$ and resonance frequencies $f_\pm$ for transitions between the spin states $m_s=0 \leftrightarrow \pm 1$. A difference $f_+ - f_-$ of the resonance frequencies $f_\pm$ depends on the external magnetic field B. The method includes recording single resonance signals $V_{SR\text{-}LIA}$ for determining the resonance frequencies $f_\pm$ by using frequency-modulated microwave radiation emitted onto the sensor material in frequency bands based on a microwave frequency $f_{MW}$ and a carrier frequency $f_{SB}$. The microwave frequency $f_{MW}$ and the carrier frequency $f_{SB}$ are selected such that the frequency bands address two magnetic resonances in succession. The method further includes recording a double resonance signal $V_{DR\text{-}LIA}$ with a dispersive form and a linear range around the resonance frequencies $f_\pm$. The microwave frequency $f_{MW}$ and the carrier frequency $f_{SB}$ are selected such that $f_{MW} \pm f_{SB} = f_\pm$ applies so that the two magnetic resonances are excited simultaneously. The method further includes determining a slope of the linear range as a scalar factor $\alpha$ from the double resonance signal $V_{DR\text{-}LIA}$, observing a detuning $\Delta_B = V_{DR\text{-}LIA}/\alpha$ of the resonance frequencies $f_\pm$ via the double resonance signal $V_{DR\text{-}LIA}$ with resonant emission of the microwave radiation due to external magnetic field changes by using an evaluation unit, controlling the frequency bands $f_{MW} \pm f_{SB}$ with a controller including a control algorithm based on the observed detuning $\Delta_B$ so that the frequency bands $f_{MW} \pm f_{SB}$ remain in the range of the resonance frequencies $f_\pm$ of the NV centers present at the detuning $\Delta_B$ even after the detuning $\Delta_B$ has occurred, and determining the external magnetic field B from a distance $2*f_{SB}$ of the frequency bands and the detuning $\Delta_B$ by using the evaluation unit.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Embodiments of the invention provide an NV magnetometer that enables an increased dynamic range and a higher bandwidth with respect to the detectable magnetic field changes as well as a better SNR in the measurements.

According to some embodiments, a method for determining an external magnetic field with an NV magnetometer with automated resonance control, wherein the NV magnetometer comprises a sensor material with NV centers with respective spin states $m_s=0, \pm 1$ and resonance frequencies $f_\pm$ for transitions between the spin states $m_s=0 \leftrightarrow \pm 1$, wherein a difference $f_+ - f_-$ of the resonance frequencies $f_\pm$ depends on the external magnetic field B, comprising the following steps:
  recording single resonance signals VSR-LIA for determining the resonance frequencies f± by means of frequency-modulated microwave radiation emitted onto the sensor material in frequency bands based on a microwave frequency fMW and a carrier frequency fSB, wherein the microwave frequency fMW and carrier frequency fSB are selected such that the frequency bands address the two magnetic resonances in succession,
  recording a double resonance signal VDR-LIA with a dispersive form and a linear range around the resonance frequency f±, wherein the microwave frequency fMW and carrier frequency fSB are selected such that fMW±fSB=f± applies so that both magnetic resonances are excited simultaneously
  determining a slope of the linear range as a scalar factor α from the demodulated signal $V_{DR-LIA}$;
  observing a detuning $\Delta_B = V_{DR-LIA}/\alpha$ of the resonance frequencies $f_\pm$ via the demodulated signal $V_{DR-LIA}$ with resonant emission of the microwave radiation due to external magnetic field changes by means of an evaluation unit;
  controlling the frequency bands $f_{MW} \pm f_{SB}$ with a controller comprising a control algorithm based on the observed detuning $\Delta_B$ so that the frequency bands $f_{MW} \pm f_{SB}$ remain in the range of the resonance frequencies $f_\pm$ of the NV centers present at this detuning $\Delta_B$ even after the detuning $\Delta_B$ has occurred; and
  determining the external magnetic field B from the distance $2 \cdot f_{SB}$ of the two frequency bands and the detuning $\Delta_B$ by means of the evaluation unit.

The term "sensor material" refers to the material that has the NV centers. This is diamond, for example.

Figure 1:
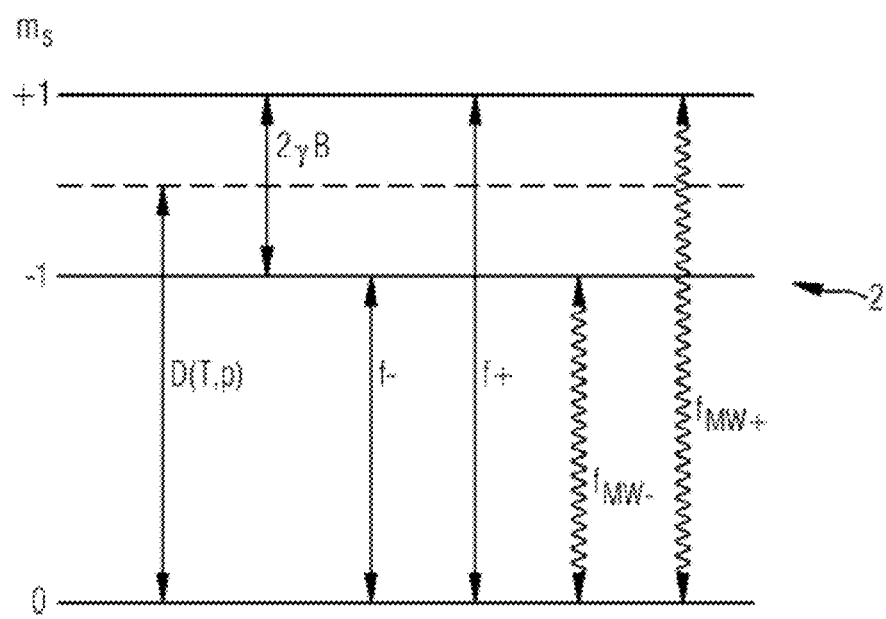
FIG. 1 shows a schematic representation of spin states of an NV center in the sensor material with the dependencies of the energy levels on the magnetic field, temperature and pressure as well as their resonance and microwave excitations, according to some embodiments.

For a more detailed explanation of the spin states $m_s=0, \pm 1$ and the resonance frequencies $f_\pm$ for transitions between the spin states $m_s=0 \leftrightarrow \pm 1$, please refer to FIG. 1.

The term "magnetic resonance" refers to the excitation of the energetically higher spin states in the NV centers and thus the absorption of microwave radiation at the resonance frequencies $f_\pm$. During the transition to the ground state, the corresponding radiation is emitted again. The magnetic resonance can be measured in absorption spectra or emission spectra, for example.

In this regard, the carrier frequency is a fixed frequency which, depending on the modulation method, is changed in its amplitude, phase position or frequency in the rhythm of the modulation frequency. For example, in frequency modulation, the frequency changes. The carrier frequency is added again when the signal is demodulated.

The so-called "scalar factor α" corresponds to the slope of the demodulated signal $V_{DR-LIA}$ in the linear range around the resonance frequency, where it has a zero crossing. Depending on the influence of the external magnetic field, the zero crossing of the demodulated signal $V_{DR-LIA}$ can be shifted in its frequency, as the external magnetic field shifts the actual resonance frequency compared to the resonance frequency without the influence of an external magnetic field. This shift is referred to as resonance detuning $\Delta_B$. By repeatedly controlling the operating point of the NV magnetometer at the point of the steepest slope of the demodulated signal (largest value of α) using the control algorithm, an improved signal-to-noise ratio of the measurement signal is obtained.

In this regard, the control algorithm can be installed and executed as a software program on a controller, wherein the controller is connected to the evaluation unit and the microwave transmitter for emitting the microwave radiation in order to excite the magnetic resonance via data or control lines so that the microwave frequency $f_{MW}$ can be controlled according to the control algorithm depending on the detuning $\Delta_B$ observed with the evaluation unit. In this regard, the evaluation unit can be designed as a processor connected to a storage medium so that the corresponding evaluation program(s) can be executed and the evaluated data can be stored.

In the NV magnetometer according to embodiments of the invention, the intelligent control algorithm, including the hardware configuration necessary for this purpose, ensures that the frequency of the microwave excitation required for sensitive sensor operation remains within the magnetic resonance range.

With the method according to embodiments of the invention, an NV magnetometer can be operated with an increased dynamic range, a higher bandwidth with respect to the detectable magnetic field changes and a better SNR in the measurements. The above-stated advantages also enable gradiometric measurements with one or more such NV magnetometers.

In one embodiment of the method or the NV magnetometer, the controlling comprises the following steps:
  comparing the demodulated signal $V_{VIA}$ with a setpoint r=0;
  calculating a deviation $e = r - V_{DR-LIA} = -V_{DR-LIA}$; and
  shifting the frequency bands of the microwave radiation in the opposite direction by ΔfMW using the controller.

By continuously adjusting the operating point of the NV magnetometer, the dynamic range of the NV magnetometer is significantly increased. After magnetic field or temperature changes, which can cause the resonance range to be exceeded, a time-consuming search for the resonance in a broad frequency spectrum is therefore no longer necessary. The bandwidth of the NV magnetometer is also increased accordingly.

In a preferred embodiment of the method or the NV magnetometer, the controller is an integral software-based controller controlling according to the rule $\Delta f_{MW}[n]=K*(e[0]+e[1]+\ldots+e[n])$ with K as the proportionality factor of the controller with $i=0, 1, \ldots, n$ as iteration steps. Here, the proportionality factor K is preferably equal to $1/\alpha$.

In one embodiment of the method or the NV magnetometer, the controller has a control period Tc, after which the microwave frequency $f_{MW}$ is again controlled with the controller, wherein the control period Tc is between 1 µs and 10 s, preferably between 0.05 s and 1 s, more preferably 0.5 s. A short control period Tc enables the tracking of rapidly changing magnetic field signals, but can also limit the bandwidth of the NV magnetometer, since setting the frequency bands incurs a dead time. In addition, a long control period Tc worsens the signal-to-noise ratio SNR, as the optimum operating point (resonance point/zero crossing) cannot be adequately maintained. A control period Tc=0.5 s is therefore preferred.

In a preferred embodiment of the method or the NV magnetometer, a signal generator generates a signal with the microwave frequency $f_{MW}$ and a further signal generator generates a frequency-modulated signal with the carrier frequency $f_{SB}$, a modulation frequency $f_m$ and a modulation amplitude $f_d$ with $f_{SB}(t)=f_{SB}+f_d*\cos(2\pi f_m t)$ with t as the time with a respective power.

In a preferred embodiment of the method or the NV magnetometer, the two signals are frequency-mixed by means of a frequency mixer and the microwave radiation emitted onto the sensor material comprises the two frequency bands $f_{MW}+f_{SB}(t)$ and $f_{MW}-f_{SB}(t)$, wherein $f_{SB}(t)$ is phase-shifted by π at $f_{MW}-f_{SB}(t)$. Preferably, the microwave frequency $f_{MW}$ and carrier frequency $f_{SB}$ are selected such in this regard that the two frequency bands are each resonant with the resonance frequencies $f_\pm$ in order to excite both magnetic resonances simultaneously.

In a preferred embodiment of the method or the NV magnetometer, both frequency bands are emitted with individually adjusted powers. By being able to adjust the power for both frequency bands separately, the difference in the scalar factors of the single resonance spectra can be minimized and thus the suppression of temperature and pressure changes in the double resonance signal can be maximized. Here, depending on the embodiment of the hardware configuration of the NV magnetometer, the powers can be individually adjusted by means of a programmable attenuator or by adjusting the power of the signal generators.

Embodiments of the invention further relate to an NV magnetometer for determining an external magnetic field B, designed to carry out a method for automated resonance control according to any one of the preceding claims, comprising a sensor material with NV centers with respective spin states ms=0, ±1 and resonance frequencies f± for transitions between the spin states ms=0↔±1, wherein a difference f+−f− of the resonance frequencies f± depends on the external magnetic field B, a microwave transmitter for excitation of magnetic resonances at the resonance frequencies f± by means of frequency-modulated microwave radiation emitted onto the sensor material in frequency bands based on a microwave frequency fMW and a carrier frequency fSB; wherein the microwave frequency fMW and carrier frequency fSB are selected for recording single resonance signals VSR-LIA such that the frequency bands address the two magnetic resonances in succession, and wherein the microwave frequency fMW and carrier frequency fSB are selected for recording a double resonance signal VDR-LIA such that fMW±fSB=f± applies so that both magnetic resonances are excited simultaneously;

a laser for emitting in a continuous wave mode with a wavelength in the range of 510-540 nm for continuous initialization and readout of the spin states, a suitable detector, preferably an optical detector, for recording frequency-modulated fluorescent light from the sensor material;

a lock-in amplifier for demodulating the fluorescent light, wherein excitation of one or both magnetic resonances results in the signals $V_{SR-LIA}$ Or $V_{DR-LIA}$ with a dispersive form and a linear range around the resonance frequency;

an evaluation unit for observing a detuning $\Delta_B=V_{DR-LIA}/\alpha$ of the resonance frequencies $f_\pm$ via the demodulated signal $V_{DR-LIA}$;

a controller for controlling the frequency bands $f_{MW}\pm f_{SB}$ with a control algorithm based on the observed detuning $\Delta_B$ so that the frequency bands $f_{MW}\pm f_{SB}$ remain in the range of the resonance frequencies $f_\pm$ of the NV centers present at this detuning $\Delta_B$ even after the detuning $\Delta_B$ has occurred;

wherein the evaluation unit is provided for determining the external magnetic field B from the distance $2*f_{SB}$ of the two frequency bands and the detuning $\Delta_B$.

In the NV magnetometer according to embodiments of the invention, the intelligent control algorithm, including the hardware configuration necessary for this purpose, ensures that the frequency of the microwave excitation required for sensitive sensor operation remains within the magnetic resonance range.

The NV magnetometer according to embodiments of the invention enables an increased dynamic range, a higher bandwidth with respect to the detectable magnetic field changes as well as a better SNR in the measurements. The above-stated advantages also enable gradiometric measurements with one or more such NV magnetometers.

In this regard, due to its special properties, the sensor material is preferably diamond.

In one embodiment, the microwave transmitter comprises a signal generator for generating a signal with the microwave frequency $f_{MW}$ and a further signal generator for generating a frequency-modulated signal with the carrier frequency $f_{SB}$, a modulation frequency $f_m$ and a modulation amplitude $f_d$ with $f_{SB}(t)=f_{SB}+f_d*\cos(2\pi f_m t)$ with t as the time with a respective power.

In a further embodiment, the signal generators are designed to adjust the power of the signals or the signal generators have an attenuator connected upstream for individual power adjustment.

Embodiments of the invention further relate to the use of one or more NV magnetometers according to embodiments of the invention for gradiometric measurements. Gradiometry is the measurement of a component of a gradient field, for example the gradient of a magnetic field. In this context, a vector component is registered simultaneously with two sensors (in this case two NV magnetometers) that are positioned a fixed distance apart. Gradiometry is used in geomagnetics. The gradient measurement requires precise and fast measurements, which are made possible by the NV magnetometer according to embodiments of the invention and the corresponding methods according to embodiments of the invention.

It should be expressly noted that expressions using solely "at least" have been avoided wherever possible in order to improve readability. Rather, an indefinite article ("one", "two", etc.) is normally to be understood as "at least one, at least two, etc.," unless it is clear from the context that "exactly" the specified number is meant.

At this point, it should also be mentioned that in the context of the present patent application, the term "in particular" is always to be understood as introducing an optional, preferred feature. The expression is therefore not to be understood as "specifically" and not as "namely".

It is to be understood that features of the solutions described above or in the claims can also be combined in deviation from the claim references, if applicable, in order to be able to realize the advantages and effects that can be achieved in the present case, either individually or cumulatively.

In addition, further features, effects and advantages of the embodiments of the present invention are explained with reference to the attached drawing and the following description. Components which at least substantially correspond in terms of their function in the individual figures are designated with the same reference symbols here, wherein the components need not be numbered and explained in all figures.

FIG. 1 shows a schematic representation of spin states of an NV center in the sensor material 2 of the NV magnetometer 1 with the dependencies of the energy levels on the magnetic field B, temperature T and pressure p as well as their resonance and microwave excitations with a microwave frequency $f_{MW}$, wherein $f_{MW+}$ denotes the microwave frequency for excitation of the resonance frequency $f_+$ and $f_{MW-}$ denotes the microwave frequency for excitation of the resonance frequency $f_-$. The spin ground state is designated with $m_s=0$ and the two excited spin states are designated with $m_s=1$ and $m_s=-1$ respectively, depending on the orientation of the spin with respect to the external magnetic field. The resonance frequencies $f_\pm$ of the magnetic resonances $m_s=0\leftrightarrow\pm1$ depend on the magnetic field B, temperature T and pressure p:

$$f_\pm = D(T, p) \pm \gamma B$$

Temperature and pressure fluctuations can be separated from magnetic field changes if both resonance frequencies $f_\pm$ are known by subtracting the two resonance frequencies from one another and the difference is only proportional to the external magnetic field B:

$$f_+ - f_- = 2\gamma B$$

$\gamma$ is the gyromagnetic ratio of the NV center in the sensor material 2 here.

FIG. 2 shows a schematic representation of (a) optically-detected magnetic resonance under emission of frequency-modulated microwave radiation on an NV center, and (b) a $V_{DR-LIA}$ signal demodulated by means of a lock-in amplifier 3. The magnetic field measurement scheme is based on the following techniques:

Lock-in detection: (Frequency) modulation of the emitted microwave (microwave frequency $f_{MW}$ and a carrier frequency $f_{SB}$) and subsequent demodulation of the optically-detected magnetic resonance by means of a lock-in amplifier 3. The demodulated signal $V_{DR-LIA}$ of the magnetic resonance has a dispersive form and is linear around the resonance frequency, see FIG. 2a.

Scalar factor α: Here, the slope ("scalar factor") of the linear range of the demodulated signal $V_{DR-LIA}$ must first be determined. The microwave is then emitted in a resonant manner. If the resonance frequency changes due to changes in the magnetic field, temperature or pressure, the detuning from the resonance frequency can be evaluated via the signal from the lock-in amplifier 3. When evaluating the difference signal of the two magnetic resonances, the influences of the temperature T and pressure p and thus any (resonance) detuning due to pressure or temperature changes ΔT are eliminated, so that only the influence of the external magnetic field as a (magnetic) detuning has the following contribution: $\Delta_B = V_{DR-LIA}/\alpha$.

Figure 2A:
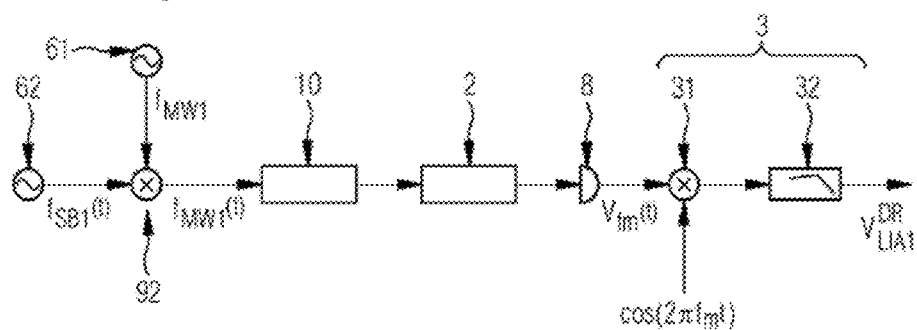
FIGS. 2a and 2b show a schematic representation of (a) a signal flow diagram and of (b) frequency portions (frequency bands) of the microwave radiation emitted onto the sensor material in a first embodiment of a magnetic field measurement scheme.
Figure 2B:
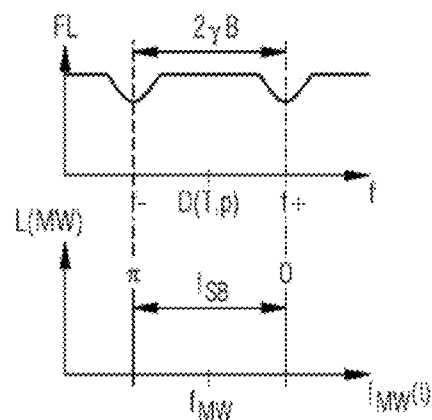

FIG. 2 shows a schematic representation of (a) a signal flow diagram for an NV magnetometer 1 according to embodiments of the invention, and of (b) frequency portions (frequency bands) of the microwave radiation emitted onto the sensor material 2 in a first embodiment of a magnetic field measurement scheme. In FIG. 2a, a signal generator 61 generates a signal with the frequency $f_{MW}$ and a further signal generator 62 generates a frequency-modulated signal with the carrier frequency $f_{SB}$, the modulation frequency $f_m$ and a modulation amplitude $f_d$:

$$f_{SB}(t) = f_{SB} + f_d\cos(2\pi f_m t)$$

The signals are then frequency-mixed in a power combiner 92 so that the signal emitted onto the sensor material 2, for example a diamond, by means of an antenna 10 contains the following frequency portions:

$$f_{MW} + f_{SB} + f_d\cos(2\pi f_m t) \text{ and } f_{MW} - f_{SB} + f_d\cos(2\pi f_m t + \pi)$$

As can be seen, the frequency mixing results in a phase difference of π or 180° between the two frequency portions. The system parameters $f_{MW}$ and $f_{SB}$ are selected such that the frequency portions are each resonant with the transitions $m_s=0\leftrightarrow\pm1$ (see FIG. 2b). The resulting magnetic resonance (fluorescence FL) is measured via an optical photodetector 8 and converted into a double resonance signal $V_{DR-LIA}$ by means of a respective lock-in amplifier 3 with a frequency mixer 31 and low-pass filter 32.

Figure 3A:
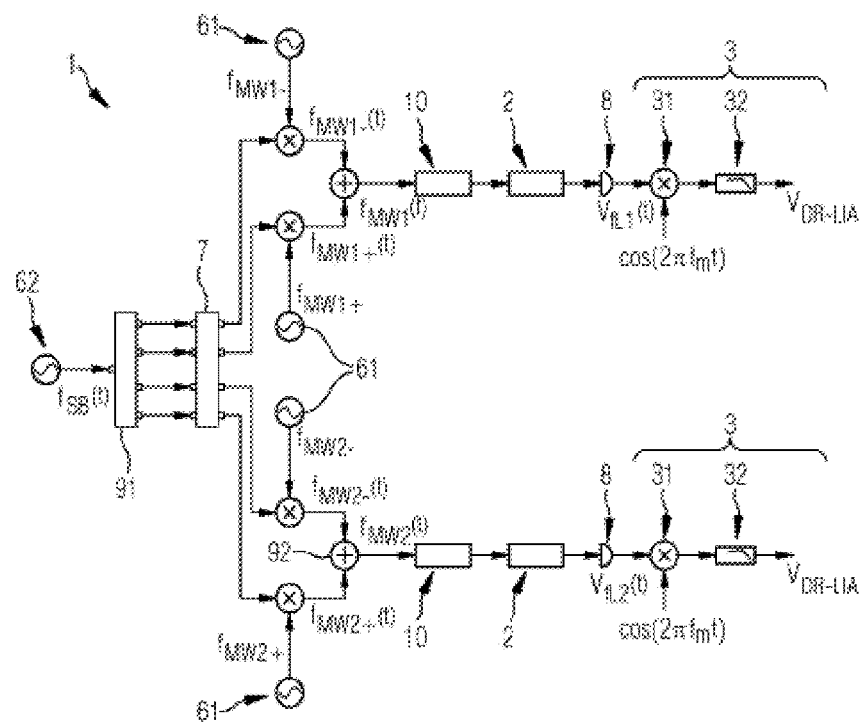
FIGS. 3a and 3b show a schematic representation of (a) a signal flow diagram and of (b) frequency portions (frequency bands) of the microwave radiation emitted onto the sensor material in a second alternative embodiment of a magnetic field measurement scheme.

FIG. 3 shows a schematic representation of (a) a signal flow diagram for an NV magnetometer 1 according to embodiments of the invention, and of (b) frequency portions (frequency bands) of the microwave radiation emitted onto the sensor material 2, here a diamond, in a second alternative embodiment of a magnetic field measurement scheme with an alternative hardware configuration of the NV magnetometer 1 compared to the configuration shown in FIG. 2. The method shown in FIG. 3a is based on the same functional principle as in FIG. 2a, but here the power of the frequency bands that address the magnetic resonances can be individually adjusted. This is achieved either by
- the programmable attenuator 7 or
- by adjusting the power of the signal generators 61, 62, which generate the microwave frequencies.

Figure 3B:
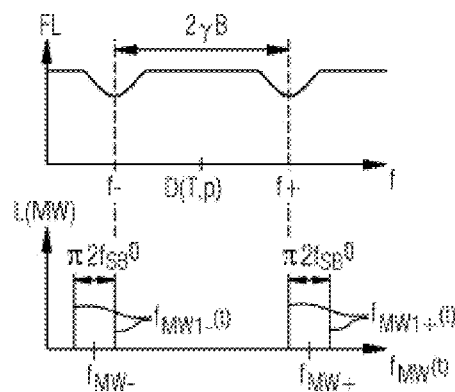

The respective frequency bands are emitted onto the sensor material 2 via respective antennas 10 and the resulting magnetic resonance (fluorescence FL) is measured via a respective optical photodetector 8 and converted into a double resonance signal $V_{DR\text{-}LIA}$ by means of a respective lock-in amplifier 3 with a frequency mixer 31 and low-pass filter 32. In order to generate the two separate frequency bands, the circuit according to FIG. 2a comprises a corresponding power splitter 91 upstream of the programmable attenuator and respective power combiners 92 for generating the microwave radiation of the respective frequency bands emitted by the respective antennas 10. By being able to adjust the power for both frequency bands separately, the difference in the scalar factors α of the single resonance spectra $V_{SR\text{-}LIA}$ can be minimized and thus the suppression of temperature and pressure changes in the double resonance signal $V_{DR\text{-}LIA}$ can be maximized. The modulation phase in FIG. 3b is indicated as 0 or π over the respective frequency portion.

Figures 4A, 4B, 4C:
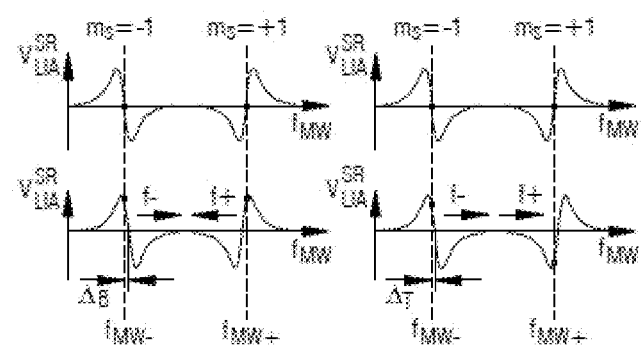
FIGS. 4a-4c show a schematic representation of (a) the single resonance signals as a function of a resonance detuning due to magnetic field changes (top: before the change; bottom: after the change), (b) the single resonance signals as a function of a resonance detuning due to pressure and temperature changes (top: before the change; bottom: after the change), and (c) a demodulated signal resulting from the addition of both single signals, according to some embodiments.

FIG. 4 shows a schematic representation of (a) the single resonance signals $V_{SR\text{-}LIA}$ as a function of the microwave frequency $f_{MW}$ depending on a resonance detuning $\Delta_B$ due to magnetic field changes (top: before the change; bottom: after the change), (b) the single resonance signals $V_{SR\text{-}LIA}$ as a function of the microwave frequency $f_{MW}$ depending on a resonance detuning $\Delta_T$ due to pressure and temperature changes (top: before the change; bottom: after the change), and (c) a demodulated signal $V_{DR\text{-}LIA}$ (double resonance signal) resulting from the addition of both single signals $V_{SR\text{-}LIA}$. In order to understand the influence of magnetic field, temperature and pressure changes on the demodulated signal $V_{DR\text{-}LIA}$, it is useful to consider the individual portions of the magnetic resonances (single resonance signals $V_{SR\text{-}LIA}$). The following conclusions can be drawn from this:
- The relative modulation phase of π or 180° between the two frequency portions results in a vertical mirroring of the single resonance signals $V_{SR\text{-}LIA}$.
- The single resonance signals $V_{SR\text{-}LIA}$ add up constructively with changes in the magnetic field, while changes in temperature and pressure lead to different signs of the single resonance signals $V_{SR\text{-}LIA}$ and these thus add up destructively.
- The double resonance signal $V_{DR\text{-}LIA}$ is therefore only dependent on changes in the magnetic field. Detunings $\Delta_B$ from the resonance frequency caused by a change in the magnetic field can thus be expressed as: $\Delta_B = V_{DR\text{-}LIA}/\alpha$.

The following measurement protocol can be derived from this:
1. Record single resonance spectrum $V_{SR\text{-}LIA}$ of the two magnetic resonances→Determination of $f_+$ and $f_-$ (resonance frequencies at the time of calibration)
2. Record double resonance spectrum $V_{DR\text{-}LIA}$→Determination of scalar factor α
3. The system parameters $f_{MW}$ and $f_{SB}$ are fixed so that the frequency portions are at $f_+$ and $f_-$→Continuous determination of the magnetic field using the following equation:

$$2\gamma B = f_+ - f_- + 2V_{DR\text{-}LIA}/\alpha$$

Figure 5A:
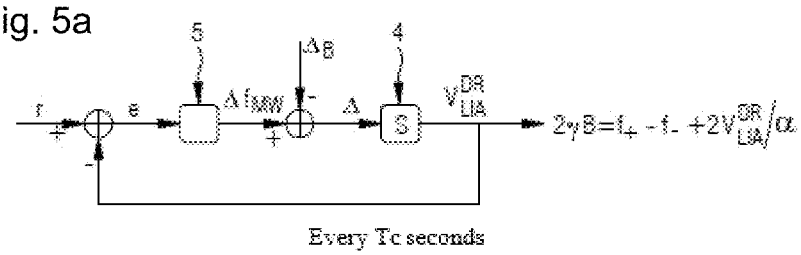
FIGS. 5a and 5b show a schematic representation of (a) a signal flow diagram for the control algorithm of the controller and (b) the resonance detuning of the demodulated signal due to a magnetic field change (left) and back-shifting by the control algorithm according to some embodiments.
Figure 5B:
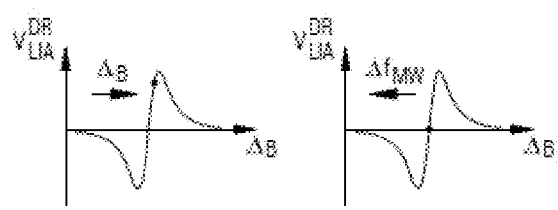

FIG. 5 shows a schematic representation of (a) a signal flow diagram for the control algorithm of the controller and (b) the resonance detuning $\Delta_B$ of the demodulated signal due to a magnetic field change (left) and back-shifting by the control algorithm. The control algorithm is based on a feedback loop, which is shown in FIG. 5a. This is based on step 3 of the measurement protocol stated above:
- a change in the magnetic field leads to a resonance detuning $\Delta_B$
- the resonance detuning $\Delta_B$ leads to a change in the output signal of the control system S, see FIG. 5b, left-hand side.

The output is then compared with the setpoint r=0 and the deviation $e=r-V_{DR\text{-}LIA}=-V_{DR\text{-}LIA}$ is calculated. In this regard, the controller 5 operates with discrete time intervals, i.e. every $T_C$ seconds.

The controller 5 then shifts the frequency bands in the opposite direction by $\Delta f_{MW}$ (by adjusting the system parameters $f_{MW}$ and $f_{SB}$), see FIG. 5b, right-hand side. An integral software-based controller 5 is used here, which controls according to the following rule:

$$\Delta f_{MW}[n] = K(e[0] + e[1] + \ldots + e[n])$$

Here, K is the proportionality factor of the controller and i=0, 1, . . . , n the iteration step. In this regard, the proportionality factor K should be selected as follows in order to eliminate the deviation (e=0): K=1/α. The following preferably applies to the control period Tc: a short control period enables the tracking of rapidly changing magnetic field signals, but can also limit the bandwidth of the NV magnetometer 1, since setting the frequency bands incurs a dead time. In addition, a long control period worsens the signal-to-noise ratio, as the optimum operating point (resonance point/zero crossing) cannot be adequately maintained. For example, a control period of $T_C$=0.5 s can be used. For the output signal of the control system $2\gamma B = f_+ - f_- + 2V_{DR\text{-}LIA}/\alpha$, $f_\pm$ denotes the position of the frequency bands after the last operation of the controller 5.

Figure 6:
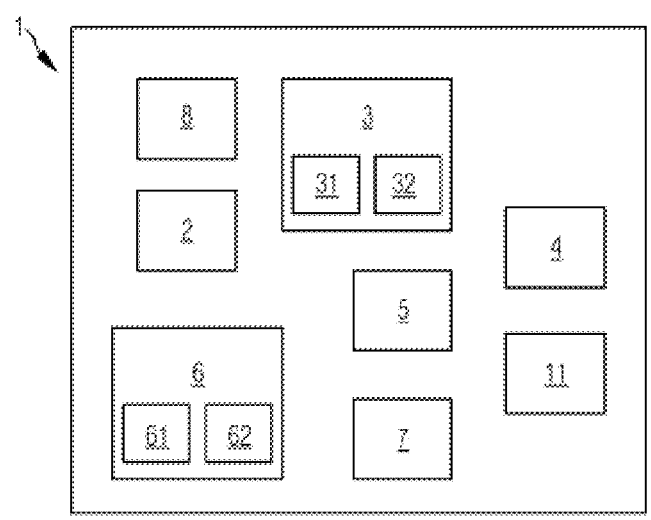
FIG. 6 shows an embodiment of the NV magnetometer.

FIG. 6 shows an embodiment of the NV magnetometer 1 according to embodiments of the invention, which comprises a sensor material 2, a lock-in amplifier 3 with a frequency mixer 31 and low-pass filter 32, an evaluation unit 4, a controller 5 with a control algorithm executed on the controller, a microwave transmitter 6 with a signal generator 61 for a signal with the microwave frequency $f_{MW}$ and with a signal generator 62 for a frequency-modulated signal with the carrier frequency $f_{SB}$, a modulation frequency fm and a modulation amplitude $f_d$, a programmable attenuator and an optical detector for recording the single resonance signals $V_{SR\text{-}LIA}$ (for example, a photodetector). Furthermore, the NV magnetometer can comprise the power splitter 91, power combiner 62 and antennas 10 not shown here for emitting the microwave radiation onto the sensor material 2 (see FIGS. 2a and 3a in this regard). In addition, the NV magnetometer 1 comprises a laser 11 for emitting in a continuous wave mode with a wavelength in the range of 510-540 nm for continuous Initialisation and readout of the spin states.

Figure 7:
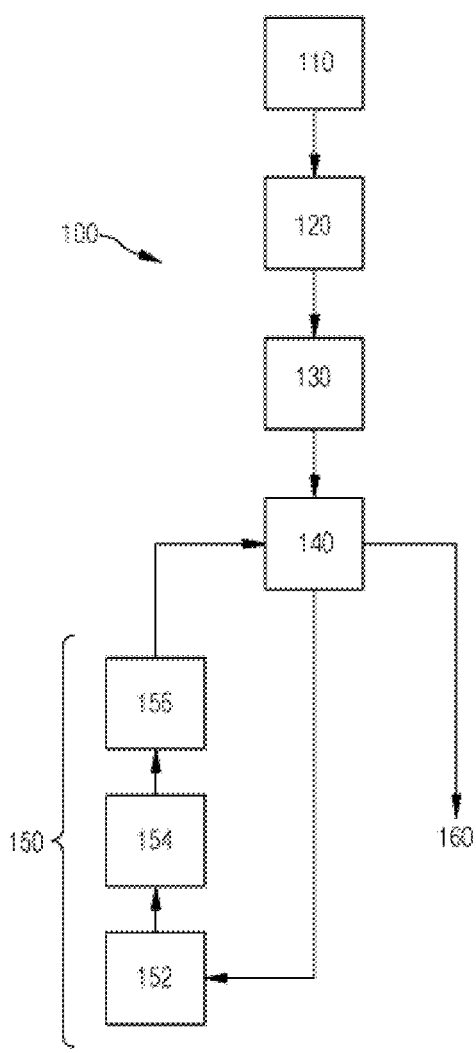
FIG. 7 illustrates a method according to embodiments of the invention.

FIG. 7 illustrates a method 100 according to embodiments of the invention for determining an external magnetic field with an NV magnetometer 1 with automated resonance control, wherein the NV magnetometer 1 comprises a sensor material 2 with NV centers with respective spin states $m_s$=0, ±1 and resonance frequencies $f_\pm$ for transitions between the spin states $m_s=0\leftrightarrow\pm1$, wherein a difference $f_+-f_-$ of the resonance frequencies $f_\pm$ depends on the external magnetic field B, comprising the following steps of recording 110 of single resonance signals $V_{SR-LIA}$ for determining the resonance frequencies $f_\pm$ by means of frequency-modulated microwave radiation emitted onto the sensor material 2 in frequency bands based on a microwave frequency $f_{MW}$ and a carrier frequency $f_{SB}$, wherein the microwave frequency $f_{MW}$ and carrier frequency $f_{SB}$ are selected such that the frequency bands address the two magnetic resonances in succession; of recording 120 of a double resonance signal $V_{DR-LIA}$ with a dispersive form and a linear range around the resonance frequency $f_\pm$, wherein the microwave frequency $f_{MW}$ and carrier frequency $f_{SB}$ are selected such that $f_{MW}\pm f_{SB}=f_\pm$ applies so that both magnetic resonances are excited simultaneously; of determining 130 a slope of the linear range as a scalar factor $\alpha$ from the demodulated signal $V_{DR-LIA}$; of observing 140 a detuning $\Delta_B=V_{DR-LIA}/\alpha$ of the resonance frequencies $f_\pm$ via the demodulated signal $V_{DR-LIA}$ with resonant emission of the microwave radiation due to external magnetic field changes by means of an evaluation unit 4; of controlling 150 the frequency bands $f_{MW}\pm f_{SB}$ with a controller 5 comprising a control algorithm based on the observed detuning $\Delta_B$ so that the frequency bands $f_{MW}\pm f_{SB}$ remain in the range of the resonance frequencies $f_\pm$ of the NV centers present at this detuning $\Delta_B$ even after the detuning $\Delta_B$ has occurred; and of determining 160 the external magnetic field B from the distance $2*f_{SB}$ of the two frequency bands and the detuning $\Delta_B$ by means of the evaluation unit 4, wherein, in this regard, the controlling 150 comprises the following steps of comparing 152 the demodulated signal $V_{DR-VIA}$ with a setpoint r=0; of calculating 154 a deviation $e=r-V_{DR-LIA}=-V_{DR-LIA}$; and of shifting 156 the frequency bands of the microwave radiation in the opposite direction by $\Delta f_{MW}$ using the controller 5. In addition, the further steps and measures of claims 3-10 can be implemented in the method 100 according to embodiments of the invention (not shown in FIG. 7)

At this point, it should be explicitly noted that features of the solutions described above or in the claims and/or figures can also be combined, if applicable, in order to be able to implement or achieve the features, effects and advantages explained in a correspondingly cumulative manner.

It should be understood that the exemplary embodiment described above is merely an initial embodiment of the present invention. In this respect, the embodiment of the invention is not limited to this exemplary embodiment.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SYMBOLS USED

1 NV magnetometer
2 Sensor material (diamond)
3 Lock-in amplifier
31 Frequency mixer
32 Low-pass filter
4 Evaluation unit
5 Controller
6 Microwave transmitter
61 Signal generator for a signal with the microwave frequency $f_{MW}$
62 Signal generator for a frequency-modulated signal with the carrier frequency $f_{SB}$, a modulation frequency $f_m$ and a modulation amplitude $f_d$
7 Programmable attenuator
8 Detector for recording the single resonance signals $V_{SR-LIA}$ (for example, a photodetector)
91 Power splitter
92 Power combiner
10 Antenna (antenna 1, antenna 2)
11 Laser
100 Method for determining an external magnetic field with an NV magnetometer with automated resonance control
110 Recording of single resonance signals $V_{SR-LIA}$ for determining the resonance frequencies $f_\pm$ by means of frequency-modulated microwave radiation emitted onto the sensor material in frequency bands
120 Recording of a double resonance signal $V_{DR-LIA}$ with a dispersive form and a linear range around the resonance frequency $f_\pm$
130 Determining a slope of the linear range as a scalar factor $\alpha$ from the demodulated signal $V_{DR-LIA}$
140 Observing a detuning $\Delta_B=V_{DR-LIA}/\alpha$ of the resonance frequencies $f_\pm$ via the demodulated signal $V_{DR-LIA}$ with resonant emission of the microwave radiation
150 Controlling the microwave frequency $f_{MW}$ with a controller comprising a control algorithm based on the observed detuning $\Delta_B$
152 Comparing the demodulated signal $V_{LIA}$ with a setpoint r=0
154 Calculating a deviation $e=r-V_{LIA}=-V_{LIA}$
156 Shifting the frequency bands of the microwave radiation in the opposite direction by $\Delta f_{MW}$ using the controller
160 Determining the external magnetic field B
$\alpha$ Scalar factor
$\gamma$ Gyromagnetic ratio of the NV center
B External magnetic field
D(T,P) Energy level dependent on pressure and temperature
$\Delta_B$ (Resonance) detuning due to magnetic field changes (magnetic detuning)
$\Delta_T$ (Resonance) detuning due to pressure or temperature changes e Deviation $e=r-V_{LIA}=-V_{LIA}$
$f_\pm$ Resonance frequencies for transitions between spin states $m_s=0\leftrightarrow\pm1$
$f_{MW}$ Microwave frequency
$f_{MW+}$ Microwave frequency for excitation of the resonance frequency $f_+$
$f_{MW-}$ Microwave frequency for excitation of the resonance frequency $f_-$
$f_{SB}$ Carrier frequency
$\Delta f_{MW}$ Shifting of the frequency bands of the microwave radiation in the opposite direction using the controller
FL Fluorescence
L Power
$m_s$ Spin states (0=ground state; ±1: excited states)
p Pressure
r Setpoint of the controller
S Output signal of the control system
T Temperature
Tc Control period
$V_{SR-LIA}$ Single resonance signals
$V_{DR-LIA}$ Demodulated signal

The invention claimed is:

1. A method for determining an external magnetic field with a nitrogen-vacancy (NV) magnetometer with automated resonance control, wherein the NV magnetometer comprises a sensor material with NV centers with respective spin states $m_s=0$, ±1 and resonance frequencies $f_\pm$ for transitions between the spin states $m_s=0\leftrightarrow\pm1$, wherein a difference $f_+-f_-$ of the resonance frequencies $f_\pm$ depends on the external magnetic field B, the method comprising:
   recording single resonance signals $V_{SR-LIA}$ for determining the resonance frequencies $f_\pm$ by using frequency-modulated microwave radiation emitted onto the sensor material in frequency bands based on a microwave frequency $f_{MW}$ and a carrier frequency $f_{SB}$, wherein the microwave frequency $f_{MW}$ and the carrier frequency $f_{SB}$ are selected such that the frequency bands address two magnetic resonances in succession;
   recording a double resonance signal $V_{DR-LIA}$ with a dispersive form and a linear range around the resonance frequencies $f_\pm$, wherein the microwave frequency $f_{MW}$ and the carrier frequency $f_{SB}$ are selected such that $f_{MW}\pm f_{SB}=f_\pm$ applies so that the two magnetic resonances are excited simultaneously;
   determining a slope of the linear range as a scalar factor $\alpha$ from the double resonance signal $V_{DR-LIA}$;
   observing a detuning $\Delta_B=V_{DR-LIA}/\alpha$ of the resonance frequencies $f_\pm$ via the double resonance signal $V_{DR-LIA}$ with resonant emission of the microwave radiation due to external magnetic field changes by using an evaluation unit;
   controlling the frequency bands $f_{MW}\pm f_{SB}$ with a controller comprising a control algorithm based on the observed detuning $\Delta_B$ so that the frequency bands $f_{MW}\pm f_{SB}$ remain in the range of the resonance frequencies $f_\pm$ of the NV centers present at the detuning $\Delta_B$ even after the detuning $\Delta_B$ has occurred; and
   determining the external magnetic field B from a distance $2*f_{SB}$ of the frequency bands and the detuning $\Delta_B$ by using the evaluation unit.

2. The method according to claim 1, wherein the controlling comprises:
   comparing the double resonance signal $V_{DR-VIA}$ with a setpoint r=0;
   calculating a deviation $e=r-V_{DR-LIA}=-V_{DR-LIA}$; and
   shifting the frequency bands of the microwave radiation in opposite direction by $\Delta f_{MW}$ using the controller.

3. The method according to claim 2, wherein the controller is an integral software-based controller controlling according to a rule $\Delta f_{MW}[n]=K*(e[0]+e[1]+\ldots+e[n])$ with K as a proportionality factor of the controller with $i=0, 1, \ldots, n$ as iteration steps.

4. The method according to claim 3, wherein the proportionality factor $K=1/\alpha$.

5. The method according to claim 1, wherein the controller has a control period Tc, after which the microwave frequency $f_{MW}$ is again controlled with the controller, wherein the control period Tc is between 1 μs and 10 s.

6. The method according to claim 1, wherein a signal generator generates a signal with the microwave frequency $f_{MW}$ and a further signal generator generates a frequency-modulated signal with the carrier frequency $f_{SB}$, a modulation frequency $f_m$ and a modulation amplitude $f_d$ with $f_{SB}(t)=f_{SB}+f_d*\cos(2\pi f_m t)$ with t as a time with a respective power.

7. The method according to claim 6, wherein the signal and the frequency-modulated signal are frequency-mixed by a frequency mixer, and the microwave radiation emitted onto the sensor material comprises two frequency bands $f_{MW}+f_{SB}(t)$ and $f_{MW}-f_{SB}(t)$, wherein $f_{SB}(t)$ is phase-shifted by π at $f_{MW}-f_{SB}(t)$.

8. The method according to claim 7, wherein the microwave frequency $f_{MW}$ and carrier frequency $f_{SB}$ are selected such that the two frequency bands are each resonant with the resonance frequencies $f_\pm$.

9. The method according to claim 6, wherein the two frequency bands are emitted with individually adjusted powers.

10. The method according to claim 9, wherein the powers are individually adjusted by a programmable attenuator or by adjusting a power of the signal generator a power of the further signal generator.

11. An NV magnetometer for determining an external magnetic field B, configured to carry out a method for automated resonance control according to claim 1, the NV magnetometer comprising
   a sensor material with NV centers with respective spin states $m_s=0$, ±1 and resonance frequencies $f_\pm$ for transitions between the spin states $m_s=0\leftrightarrow\pm1$, wherein a difference $f_+-f_-$ of the resonance frequencies $f_\pm$ depends on the external magnetic field B,
   a microwave transmitter for excitation of magnetic resonances at the resonance frequencies $f_\pm$ by frequency-modulated microwave radiation emitted onto the sensor material in frequency bands based on a microwave frequency $f_{MW}$ and a carrier frequency $f_{SB}$, wherein the microwave frequency $f_{MW}$ and carrier frequency $f_{SB}$ are selected for recording single resonance signals $V_{SR-LIA}$ such that the frequency bands address two magnetic resonances in succession, and wherein the microwave frequency $f_{MW}$ and carrier frequency $f_{SB}$ are selected for recording a double resonance signal $V_{DR-LIA}$ such that $f_{MW}\pm f_{SB}=f_\pm$ applies so that the two magnetic resonances are excited simultaneously;
   a laser for emitting in a continuous wave mode with a wavelength in a range of 510-540 nm for continuous initialization and readout of the spin states,
   a detector for recording frequency-modulated fluorescent light from the sensor material;
   a lock-in amplifier for demodulating the fluorescent light, wherein excitation of one or both magnetic resonances results in the single resonance signals $V_{SR-LIA}$ or the double resonance signal $V_{DR-LIA}$ with a dispersive form and a linear range around the resonance frequency $f_\pm$;

an evaluation unit for observing a detuning $\Delta_B = V_{DR-LIA}/\alpha$ of the resonance frequencies $f_\pm$ via the double resonance signal $V_{DR-LIA}$; and a controller for controlling the frequency bands $f_{MW} \pm f_{SB}$ with a control algorithm based on the observed detuning $\Delta_B$ so that the frequency bands $f_{MW} \pm f_{SB}$ remain in the range of the resonance frequencies $f_\pm$ of the NV centers present at this detuning $\Delta_B$ even after the detuning $\Delta_B$ has occurred;

wherein the evaluation unit is provided for determining the external magnetic field B from the distance $2*f_{SB}$ of the two frequency bands and the detuning $\Delta_B$.

12. The NV magnetometer according to claim 11, wherein
the microwave transmitter comprises a signal generator for generating a signal with the microwave frequency $f_{MW}$ and a further signal generator for generating a frequency-modulated signal with the carrier frequency $f_{SB}$, a modulation frequency $f_m$ and a modulation amplitude $f_d$ with $f_{SB}(t) = f_{SB} + f_d * \cos(2\pi f_m t)$ with t as a time with a respective power.

13. The NV magnetometer according to claim 12, wherein
the signal generators are designed to adjust the power of the signals or the signal generators have an attenuator connected upstream for individual power adjustment.

14. The NV magnetometer according to claim 11, wherein
the sensor material is diamond.

* * * * *